United States Patent
Du et al.

(10) Patent No.: US 8,188,615 B2
(45) Date of Patent: May 29, 2012

(54) INTEGRATED CIRCUIT ADAPTED TO BE SELECTIVELY AC OR DC COUPLED

(75) Inventors: Yamin Du, Toronto (CA); Richard Fung, Thornhill (CA); Pouya Ashtiani, Richmond Hill (CA)

(73) Assignee: ATI Technologies ULC, Markham, Ontario (CA)

( * ) Notice: Subject to any disclaimer, the term of this patent is extended or adjusted under 35 U.S.C. 154(b) by 130 days.

(21) Appl. No.: 12/562,703

(22) Filed: Sep. 18, 2009

(65) Prior Publication Data

US 2011/0068632 A1    Mar. 24, 2011

(51) Int. Cl.
*H02J 3/02* (2006.01)
(52) U.S. Cl. .......................................... 307/2; 307/113
(58) Field of Classification Search ............... 307/2, 113
See application file for complete search history.

(56) References Cited

U.S. PATENT DOCUMENTS

| | | | |
|---|---|---|---|
| 5,864,457 A | 1/1999 | Kates et al. | |
| 6,253,267 B1 | 6/2001 | Kim et al. | |
| 6,574,695 B1 | 6/2003 | Mott et al. | |
| 6,968,413 B2 | 11/2005 | Cranford, Jr. et al. | |
| 7,053,657 B1 * | 5/2006 | Peng | 326/68 |
| 7,138,730 B2 | 11/2006 | Lai | |
| 7,533,208 B2 | 5/2009 | Strangfeld et al. | |
| 7,719,137 B2 | 5/2010 | Jitaru et al. | |
| 2009/0322157 A1 * | 12/2009 | Harb et al. | 307/99 |
| 2010/0176848 A1 | 7/2010 | Du et al. | |
| 2010/0283439 A1 * | 11/2010 | Singh et al. | 323/282 |

FOREIGN PATENT DOCUMENTS

WO    2009/006123 A1    1/2009

OTHER PUBLICATIONS

International Search Report mailed Dec. 14, 2010, in relation to PCT Application No. PCT/CA2010/001427 filed Sep. 14, 2010.
Written Opinion mailed Dec. 14, 2010, in relation to PCT Application No. PCT/CA2010/001427 filed Sep. 14, 2010.

* cited by examiner

*Primary Examiner* — Robert L. Deberadinis
(74) *Attorney, Agent, or Firm* — Faegre Baker Daniels LLP

(57) ABSTRACT

An integrated circuit is adapted to be selectively AC or DC coupled to an external device at a coupling point. The integrated circuit includes a first connector connected to the coupling point by way of a coupling capacitor for AC coupling, a second connector connected to the coupling point for DC coupling, and a switch to selectively short the first and second connectors and thereby the coupling capacitor, when the integrated circuit is DC coupled to the device. The switch may be a MOSFET bridge comprising a switch control MOSFET interconnected between the first and second connectors, with the switch control MOSFET receiving at its gate a mode status signal for turning on the switch control MOSFET and thereby shorting the MOSFET bridge when the integrated circuit is DC coupled to the external device. The MOSFET bridge also includes a number of dynamically biased nMOSFETs connected in series with the switch control MOSFET in order to protect switch control MOSFET from high external supply voltages, and a number of dynamically biased pMOSFETs connected in parallel with the switch control MOSFET.

16 Claims, 5 Drawing Sheets

US 8,188,615 B2

INTEGRATED CIRCUIT ADAPTED TO BE SELECTIVELY AC OR DC COUPLED

FIELD OF THE INVENTION

The present invention relates generally to integrated circuits and, more specifically, to integrated circuits that may be selectively AC or DC coupled.

BACKGROUND

Electronic circuits and devices may be DC or AC coupled to other circuits or devices. DC coupling allows both the AC and DC components of a signal to pass, while AC coupling uses a coupling capacitor to filter the DC component from a signal with both AC and DC components.

Certain circuits are designed to be selectively AC or DC coupled. However, the presence of a coupling capacitor in the circuit gives rise to parasitic effects when the circuit is DC coupled. Consequently, such circuits are typically designed to disconnect or short the coupling capacitor when DC coupled.

For integrated circuits, coupling capacitors are typically formed external to the integrated circuit—off-chip. A number of off-chip components are commonly used to disconnect or short the coupling capacitor.

As modern circuits become increasingly integrated, an improved approach which reduces the number of board components is desirable.

SUMMARY OF THE INVENTION

In an aspect of the present invention, there is provided an integrated circuit adapted to be selectively AC or DC coupled at a coupling point to an external device. The integrated circuit comprises a first connector connected to the coupling point by way of a coupling capacitor for AC coupling; a second connector connected to the coupling point for DC coupling; and a switch to selectively short the first and second connectors and thereby the coupling capacitor, when the integrated circuit is DC coupled to the device.

In a further aspect of the present invention, there is provided a method of selectively AC or DC coupling an integrated circuit to an external circuit at a coupling point, the integrated circuit comprising a first connector connected to the coupling point by way of an external coupling capacitor for AC coupling and a second connector connected to the coupling point for DC coupling, the method comprising: closing a switch formed within the integrated circuit, to selectively short the first and second connectors and thereby the coupling capacitor, when the integrated circuit is DC coupled to the device.

In a further aspect of the present invention, there is provided computer readable medium storing code of a hardware description language for the formation of an integrated circuit, exemplary of embodiments of the present invention.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In the figures which illustrate embodiments of the invention by example only.

DETAILED DESCRIPTION

Figure 1:
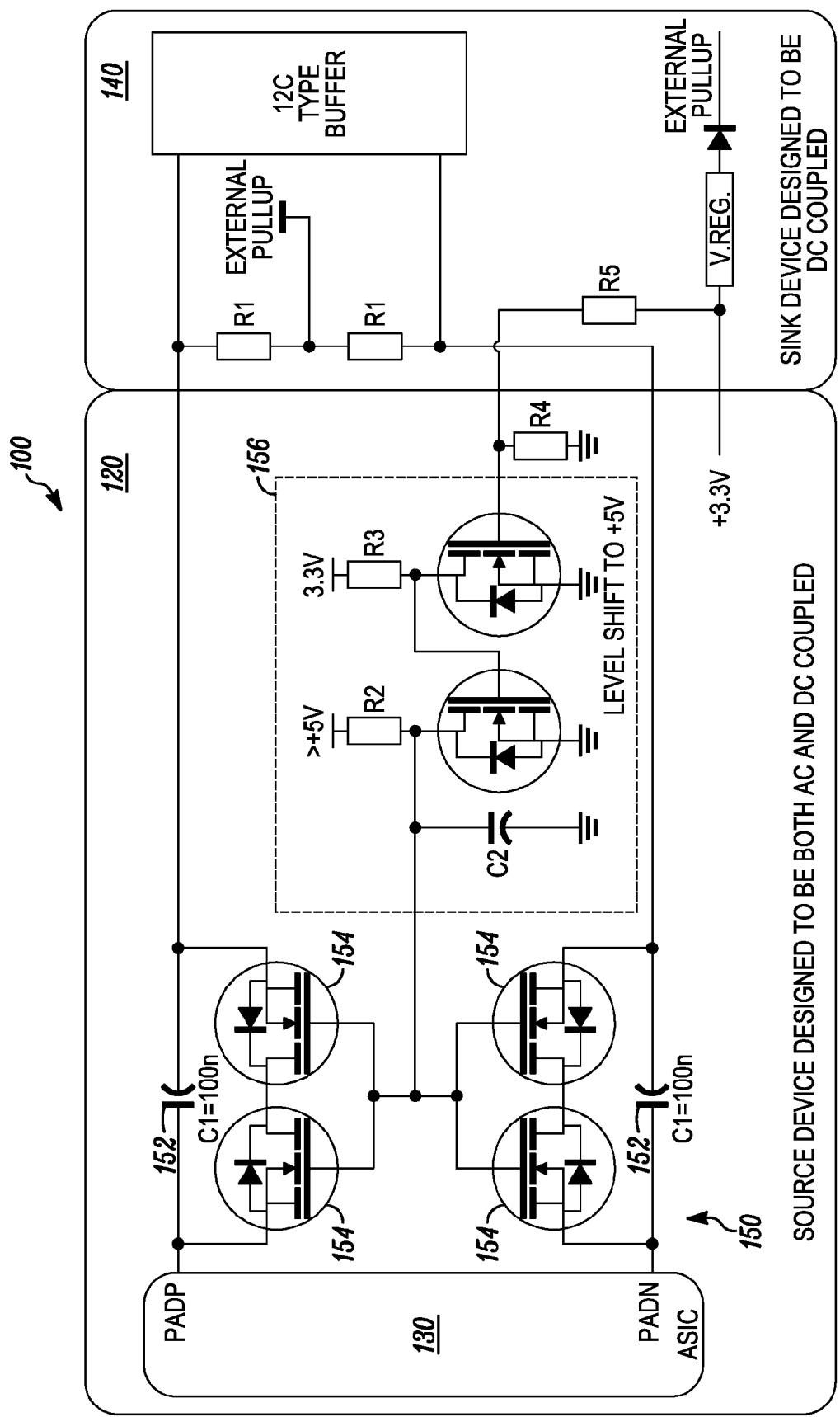
FIG. 1 is a schematic block diagram illustrating a typical circuit designed to be selectively AC or DC coupled.

FIG. 1 illustrates a conventional circuit 100 on a board 120 designed to be selectively AC or DC coupled. As shown, circuit 100 is coupled to an external sink device 140. Circuit 100 includes an integrated circuit chip (IC) 130 and board components 150. Board components 150 include two AC coupling capacitors 152, a transistor switch 154 to short the AC coupling capacitors 152, and buffering circuitry 156 to drive the gates of transistor switch 154 based on the detection of the type of sink device 140. As will be appreciated, board components 150 are off-chip, and therefore take up a significant amount of surface area on board 120. Further, the use of off-chip components typically increases the overall price of the finished circuit board.

Figure 2A:
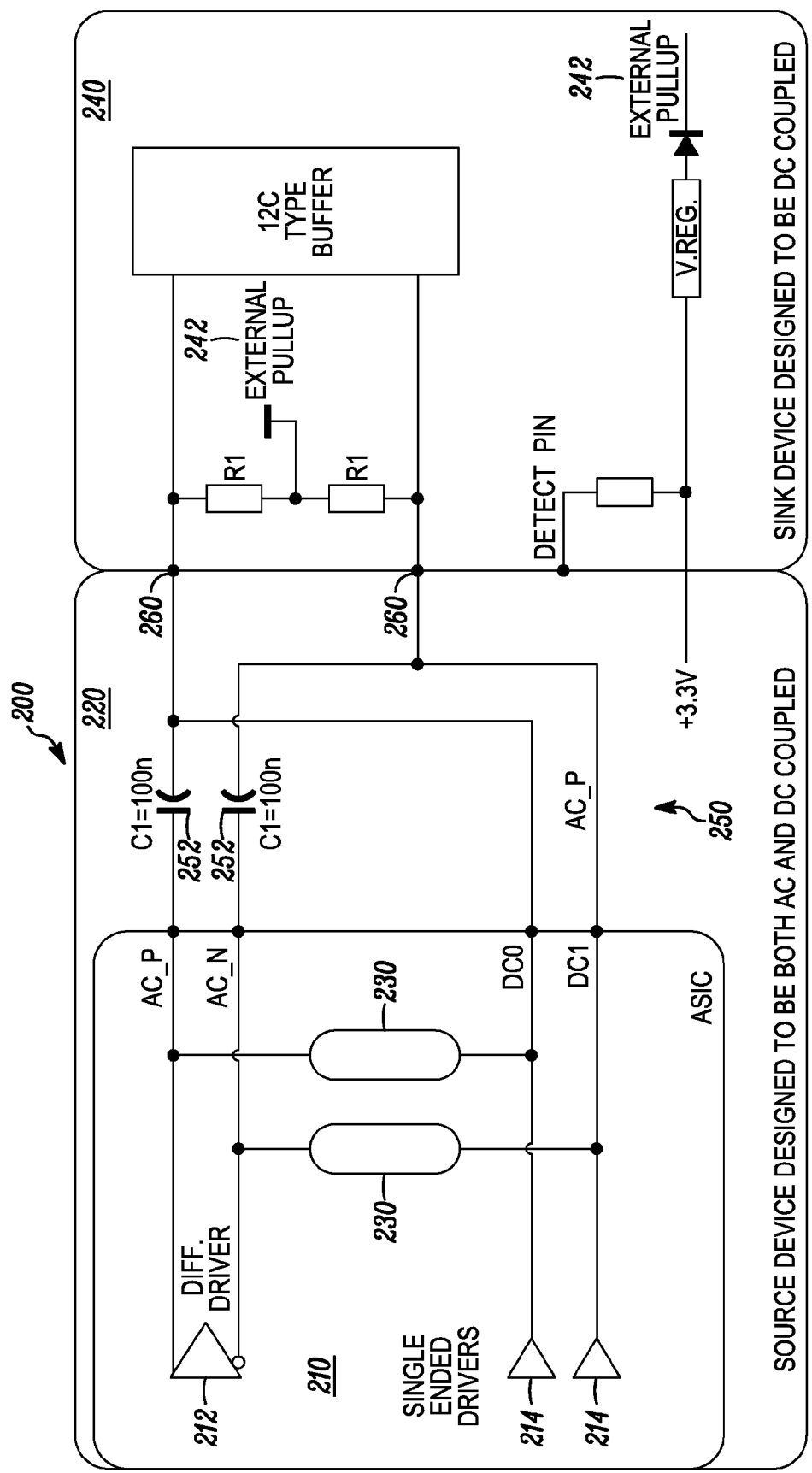
FIG. 2A is a schematic block diagram illustrating a circuit designed to be selectively AC or DC coupled, exemplary of an embodiment of the present invention.

FIG. 2A illustrates a circuit 200 exemplary of an embodiment of the present invention. Circuit 200 is built on a board 220 and is designed to be selectively AC or DC coupled. As illustrated, board 220 may be coupled at coupling points 260 to an external sink device 240.

Circuit 200 includes an IC 210 mounted on board 220 and board components 250 also formed on board 220. Board components 250 include two AC coupling capacitors 252. IC 210 includes two AC connectors (AC_P and AC_N) connected to coupling points 260 by way of coupling capacitors 252 for AC coupling, and two DC connectors (DC0 and DC1) connected to coupling points 260 for DC coupling.

IC 210 also includes a differential driver 212 and two single ended drivers 214. The design of differential driver 212 and single ended drivers 214 may for example be based on pending U.S. patent application No. 61/081,515, entitled "INPUT/OUTPUT BUFFER WITH MULTI-FUNCTION OPERATION AND HIGH VOLTAGE TOLERANCE", filed on Jul. 17, 2008, the subject matter of which is incorporated by reference herein. Differential driver 212 and single-ended drivers 214 are turned on or off by control signals upstream. They are typically not turned on at the same time, but may both be turned off at the same time.

IC 210 also includes two switches 230 interposed between the AC_P/AC_N and DC0/DC1 connectors, respectively. As described in more detail below, switches 230 are configured to short the AC_P/AC_N and DC0/DC1 connectors, thereby shorting AC coupling capacitors 252, when IC 210 is DC coupled. In other words, IC 210 is capable of selectively shorting AC coupling capacitors 252 depending on the type of coupling (AC or DC) detected. Advantageously, this approach brings the switch (and associated circuitry) for shorting the coupling capacitors inside the IC, thus reducing the number of board components required to implement selective AC/DC coupling.

Detection of coupling mode is done via weak pull-down resistors and Schmitt trigger receivers (not shown) integrated into IC 210. On power up, IC 210 automatically configures to DC coupling mode and sets a mode status signal (Modeb) to logic high. A pad controller (not shown) enables the weak pull down resistors and receivers and monitors the receivers output. When the receivers output is logic high, an external pull up voltage exists, and the pad controller sets Modeb to logic high for DC coupling mode. When the receivers output is logic low, the pad may be either floating or AC coupled. The pad controller checks a detect pin (shown in FIG. 2A) in the AUX connector (not shown) which is received as an input by IC 210. If the receivers output for the detect pin input is logic high, the pad is floating and the pad controller maintains the DC coupling mode setting. If the receivers output for the detect pin input is logic low, the pad is AC coupled, and the pad controller sets Modeb to logic low for AC coupling mode.

Figure 2B:
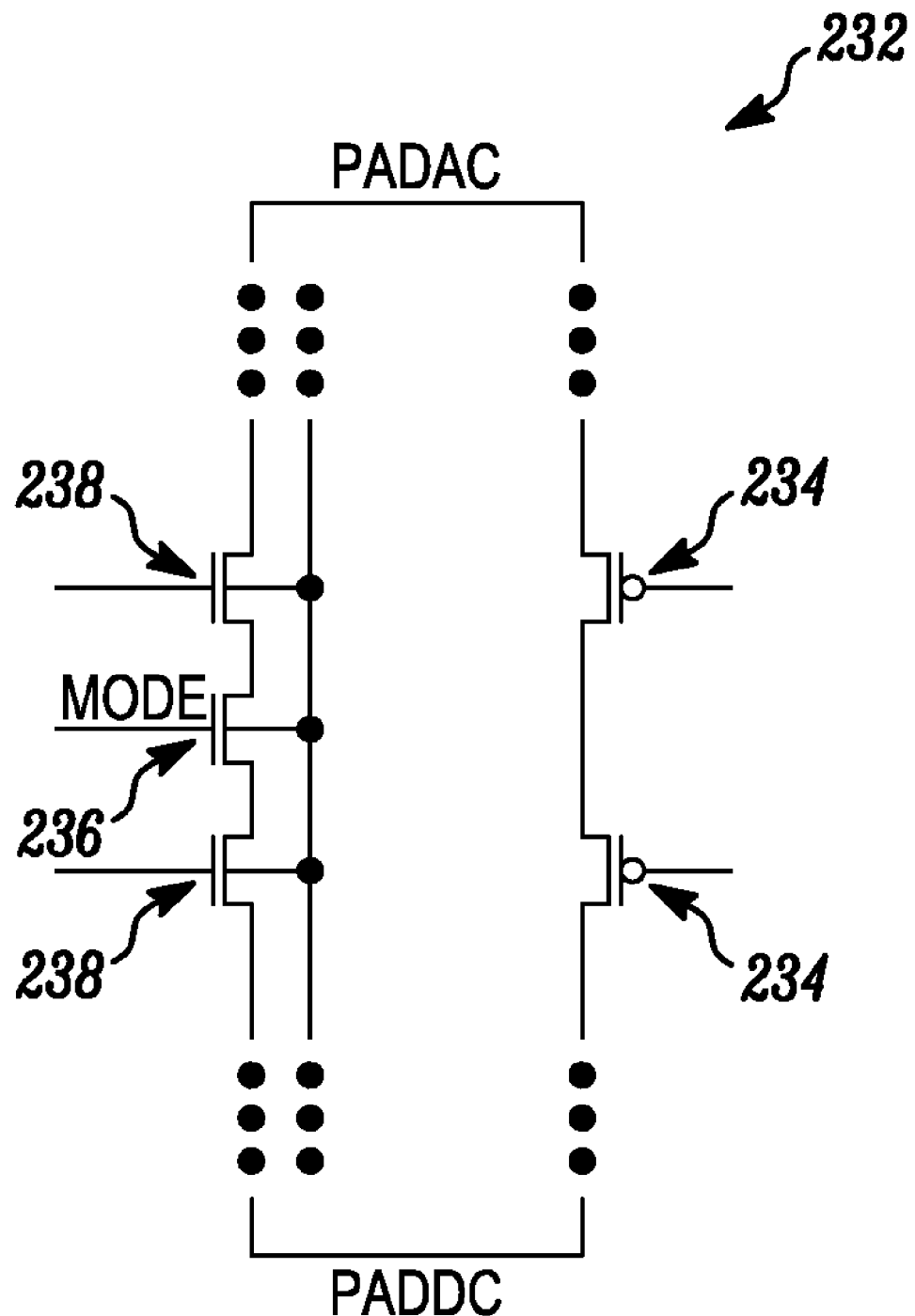
FIG. 2B is a schematic block diagram of an exemplary MOSFET bridge in the circuit of FIG. 2A.

Preferably, each switch 230 is implemented as a Metal-Oxide-Semiconductor Field-Effect Transistor (MOSFET) bridge such as MOSFET bridge 232 shown in FIG. 2B. MOSFET bridge 232 includes a switch control MOSFET 236, dynamic bias nMOSFETs 238, and dynamic bias pMOSFETs 234.

Switch control MOSFET 236 controls whether MOSFET bridge 232 is on (switch is closed) or off (switch is open). Switch control MOSFET 236 receives at its gate the mode status signal Modeb which, as described above, comes from IC 210 core based on device detection (Modeb=logic 0 for AC coupling, and Modeb=logic 1) for DC coupling. Thus, when board 220 is AC coupled, switch control MOSFET 236—and hence MOSFET bridge 232—is off; and when board 220 is DC coupled, switch control MOSFET 236—and hence MOSFET bridge 232—is on.

nMOSFETs 238 are arranged in series with switch control MOSFET 236 as shown in FIG. 2B. As further described below, nMOSFETs 238 are dynamically biased in order to protect switch control MOSFET 236 from high voltages at the DC0/DC1 connectors required by certain DC coupled interfaces. The number of dynamically biased nMOSFETs 238 in each MOSFET bridge 232 depends on the multiplication factor of the external supply tolerance required (as shown in FIG. 2A, external pull-up supply 242). Thus, depending on the multiplication factor of external pull-up supply 242, a number of bias voltages are generated internally by sourcing current from external pull-up 242 through the R1 and DC0/DC1 connectors. These bias voltages are designed such that the maximum gate-to-source voltage (VGS) of the bridge MOSFETs is not violated. Preferably, the bridge MOSFETs lie in a floating well (not shown) for maximum gate-to-bulk voltage (VGB) not to be violated. Each nMOSFET 238 offers a step down voltage at its drain depending on its VGS. By chaining enough dynamically biased nMOSFETs 238 one can achieve multiple step down voltages relative to external pull-up.

pMOSFETs 234 are arranged in parallel with switch control MOSFET 236 and dynamic bias nMOSFETs 238 (FIG. 2B). pMOSFETs 234, which as further described below are also dynamically biased, address the dynamic range limitations associated with single-channel MOS switches.

Figure 3:
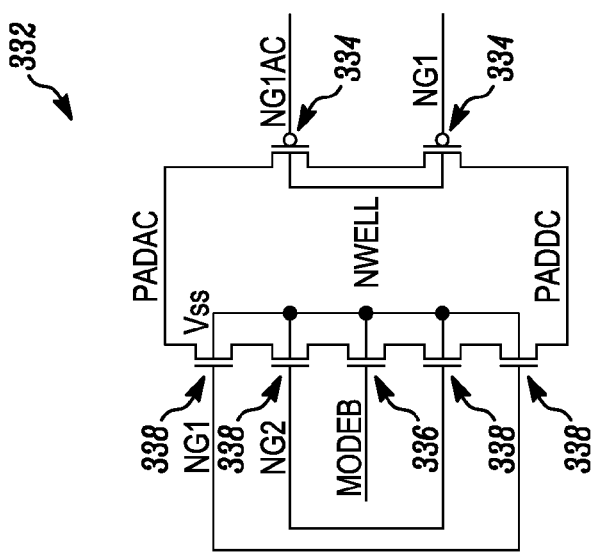
FIG. 3 is a schematic block diagram illustrating an example MOSFET bridge of FIG. 2B.

FIG. 3 illustrates an exemplary MOSFET bridge 332 for use as switch 230. MOSFET bridge 332 employs 1× transistors and 1× Vddio power supply voltage (1.8V in the example), and supports 3× external pull up supply (5.0V in the example) in DC coupling mode, where × is a scale factor. MOSFET bridge 332 includes a switch control MOSFET 336, four dynamic bias nMOSFETs 338, and two dynamic bias pMOSFETs 334. Since each 1×MOS transistor can withstand 1× volt between its drain and source, drain and gate, and source and gate, the cascaded arrangement is used to support 3× external pull up supply.

The Modeb signal received at the gate of switch control MOSFET 336 is a mode status signal provided by IC 210 core based on device detection (Modeb=0 for AC coupling, and Modeb=1.8V for DC coupling). The Nwell should be floating since the design employs 1× Vddio power supply (1.8V in the example) whereas external pull up 242 may be 3× (5V in the example). The Nwell in MOSFET bridge 332 may be shared with single ended drivers 214 in order to save silicon area, as both Nwells have the same behaviour.

As further described below, the bias signals NG1 and NG2 are generated from a variable and dynamic bias generation circuit which samples DC0/DC1 voltage, and the signal NG1AC is generated from another variable and dynamic bias generation circuit which samples AC_P/AC_N voltage.

When an AC connection is detected (i.e., Modeb=0) and selected, switch control MOSFET 336 is turned off, and signal NG1 is 1.8V, resulting in an open connection at MOSFET bridge 332 if PADAC/PADDC voltage is less than 1.8V+Vthp. With reference to FIG. 2A, the result is an open connection at switches 230 between the AC_P/AC_N and DC0/DC1 connectors, respectively. In AC coupled mode, AC_P/AC_N voltage is defined by IC 210 itself and the maximum voltage is less than 1.8V. DC0/DC1 is connected to the external sink device directly. The maximum allowable voltage at DC0/DC1 is 1.8V+Vthp. A voltage greater than 1.8+Vthp at DC0/DC1 would turn the pMOSFETs 334 on since Vsg=([1.8+Vthp]−1.8)=Vthp, where Vthp is an absolute value. The minimum allowable voltage at DC0/DC1 is −Vthn. NG1 is lowered to 1.8−Vthn to extend the voltage dynamic range at DC0/DC1 by protecting transistors from over stress voltage when voltages at DC0/DC1 are equal to −Vthn (for example, for nMOSFET 338 Vgs=[(1.8−Vthn)−(−Vthn)]=1.8V). Single ended drivers 214 are turned off with high impedance and high voltage tolerance and differential driver 212 is configured to turn on.

When a DC connection is detected (i.e., Modeb=1.8V) and selected, switch control MOSFET 336 is turned on, resulting in a shorted connection at MOSFET bridge 332. With reference to FIG. 2A, the result is a shorted connection at switches 230 between the AC_P/AC_N and DC0/DC1 connectors, respectively. Differential driver 212 is configured to turn off with high impedance and high voltage tolerance (for example DDC mode) and single ended drivers 214 are used to transmit data. As described below, external pull-up 242 will charge internal dynamic bias circuits which will ramp the voltages at the gates of dynamic bias MOSFETs 334, 338 in MOSFET bridge 332.

Node voltages of MOSFET bridge 332 in AC and DC coupling are listed in Table 1:

TABLE 1

Bridge Operation Analysis 1X Power, 1X Transistors & 3X External Pull up

| Coupling | NG1 | NG2 | Modeb | NG1AC | Nwell | PADDC & PADAC | External Pull Up |
|---|---|---|---|---|---|---|---|
| AC | 1.8−Vthn (1x) | 1.8−Vthn (1x) | 0 | 1.8 V (1x) | 1.8 V (1x) | AC output | N/A |
| DC | 3.6 V (2x) | 1.8 V (1x) | 1.8 V (1x) | 3.6 V (2x) | 5.0 V (3x) | 5 V (3x) | 5 V (3x) |
| DC | 1.8 V (1x) | 1.8 V (1x) | 1.8 V (1x) | 1.8 V (1x) | 1.8−Vthn | 0 | 5 V (3x) |

Figure 4:
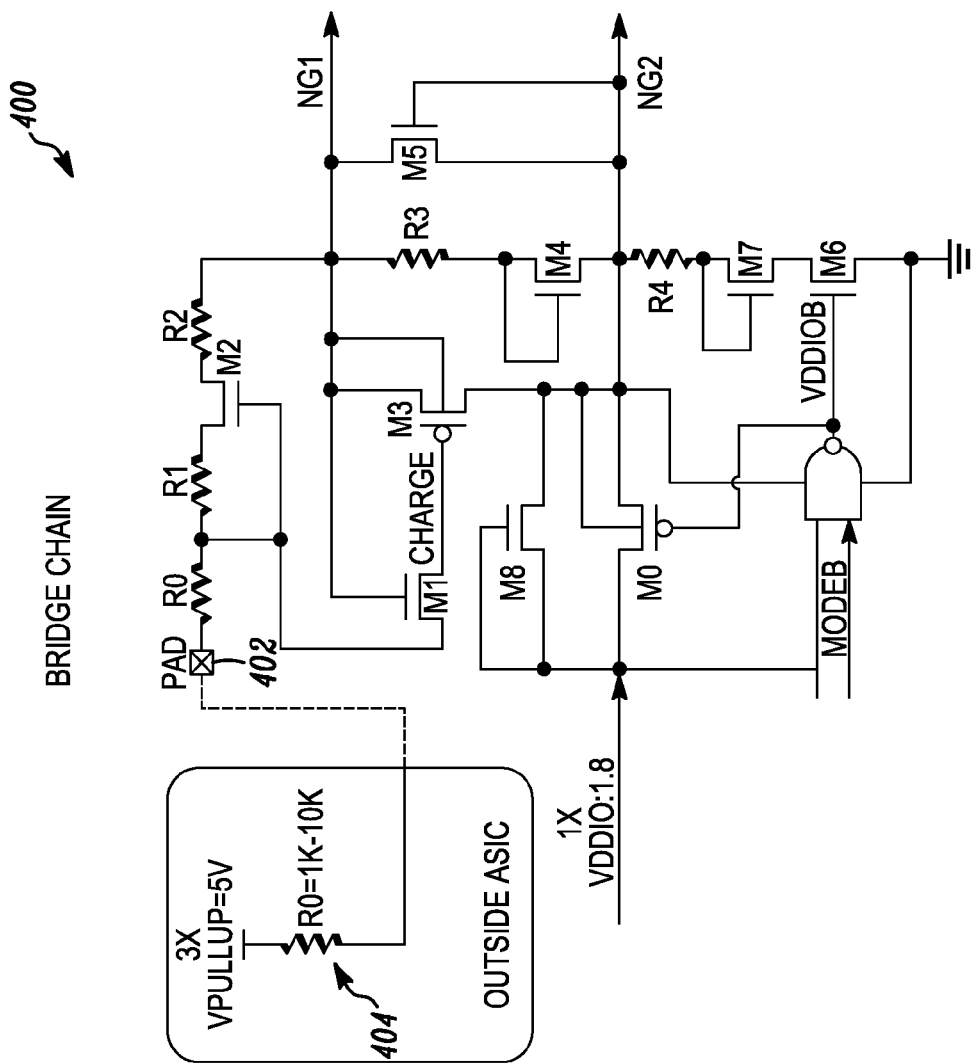
FIG. 4 is a schematic block diagram illustrating a circuit to generate signals NG1 and NG2 of FIG. 3.

FIG. 4 illustrates an exemplary variable and dynamic bias circuit 400 designed to generate the signals NG1 and NG2 of FIG. 3. Transistors M1 and M5 are low threshold devices and other devices are regular ones. Transistor M1 is always on and traces the PAD 402 voltage level dynamically. Transistor M8 is diode connected and always on if IC 210 power Vddio exists.

When in DC coupled mode, the dynamic bias circuit 400 may encounter two possible scenarios: 1× Vddio is off and 3× external pull up is on, or both 1× Vddio and 3× external pull up are on. When 1× Vddio (1.8V in this example) is off and 3× external pull up power (5.0V in this example) is applied at PAD 402, diode connected transistors M2, M4 and M7 are on and transistors M3 and M5 are off. Vddiob is high, therefore transistor M6 is on and transistor M0 is off. Bias signals NG1 and NG2 are thus generated from what is effectively a voltage divider and are equal to about 3.6V and 1.8V, respectively. When both 1× Vddio and 3× external pull up power are on, Modeb is high (1.8V in this example), Vddiob is 0 and transistor M6 is off, transistor M0 is on and NG2 is shorted with Vddio. In other words, signal NG2 is 1.8V regardless of PAD 402 status. When PAD 402 is 5V, transistors M2 and M4 are on, transistors M3 and M5 are off, and both NG1 and Charge are 3.6V. When PAD 402 is 0, transistors M2 and M4 are off, transistors M3 and M5 are on, and NG1 is 1.8V and Charge is 0. The circuit will draw about 20-30 u current from the 3× external pull up and the voltage drop across external pull up resistor 404 (1 k-10 k resistor in this example) is 200 mv at most. The voltage drop across the pull up resistor 404 is about 4% of the 3× pull up power and can be neglected.

When in AC coupled mode, signal Modeb is 0 and Vddiob is high at NG2 level, therefore transistor M6 is on and transistor M0 is off. NG2 is 1.8-Vthn since transistor M8 and M7 are diode connected and always on. As previously noted, the maximum allowable voltage range at 402 in AC coupled mode is between 1.8+Vthp and −Vthn, therefore, transistors M4 and M2 are off, transistors M3 and M5 are on and bias signal NG1 is also equal to 1.8-Vthn.

When MOSFET bridge 332 is used in the circuit 200 of FIG. 2A, the differential driver 212 and single ended drivers 214 are also implemented with 1× voltage tolerant devices, 1× power supply voltage, and support for 3× external pull up voltage.

Differential driver 212 supports both AC interface standards, such as DisplayPort Auxiliary (DP AUX), and DC interface standards, such as open drain interface or Display Data Channel (DDC). DP AUX terminates with 50 ohm impedance at both source and destination sides as required by the DisplayPort standard. External device detection is performed at power up or plug/unplug connection to determine what kind of panels, for example, DP or HDMI/DVI, are connected and to configure differential driver 212 to the correct mode.

Single ended drivers 214 only support DC interface standards, such as open drain interface or Display Data Channel (DDC). The external pull up voltage of DDC interface can be up to 3× higher than the IC 1× power supply voltage and the maximum allowable 1× device voltage. When the 3× external pull up voltage is on and IC 1× power supply voltage is off, both 1× and 2× bias voltages have to be generated internally from the 3× external pull up voltage to protect the 1× voltage tolerant devices. When the IC 1× power supply voltage is on, only the 2× bias voltage is generated from the 3× external pull up voltage and the 1× bias voltage is derived from the IC 1× power supply voltage. The N-well of the IC PMOS output buffer should be floating since the 3× external pull voltage up is greater than the IC 1× power supply voltage.

Figure 5:
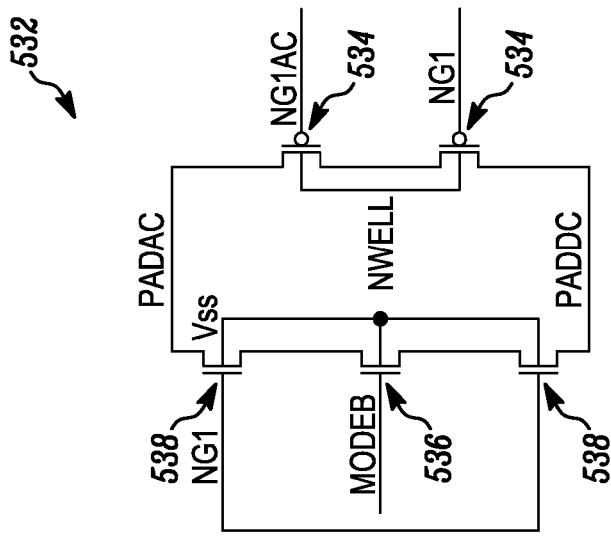
FIG. 5 is a schematic block diagram illustrating a further example MOSFET bridge of FIG. 2B.

FIG. 5 illustrates an exemplary MOSFET bridge 532 for use as switch 230 with 1× voltage tolerant devices, 1× power supply voltage (2.5V in this example) and support for 2× external pull up voltage (5.0V in this example). MOSFET bridge 532 includes a switch control MOSFET 536, two dynamic bias nMOSFETs 538, and two dynamic bias pMOSFETs 534.

The Modeb signal received at the gate of switch control MOSFET 536 is a mode status signal which comes from IC 210 core based on device detection (Modeb=0 for AC coupling, and Modeb=2.5V for DC coupling).

As is further described below, the bias signal NG1 is generated from a variable and dynamic bias generation circuit which samples DC0/DC1 voltage, and the signal NG1AC is generated from another variable and dynamic bias generation circuit which samples AC_P/AC_N voltage. The signal Nwell in MOSFET bridge 532 may be shared with an Nwell signal (not shown) in single ended drivers 214 in order to save silicon area, as both Nwells have the same behaviour.

When an AC connection is detected and selected (i.e., Modeb=0), switch control MOSFET 536 is turned off, resulting in an open connection at MOSFET bridge 532. With reference to FIG. 2A, the result is an open connection at switches 230 between the AC_P/AC_N and DC0/DC1 connectors, respectively. In AC coupled mode, the maximum allowable voltage range across DC0 and DC1 is between 2.5V+Vthp and −Vthn, where Vthn and Vthp are MOSFET absolute value threshold voltages. Single ended drivers 214 are turned off with high impedance and high voltage tolerance and differential driver 212 is configured to turn on.

When a DC connection is detected and selected (i.e., Modeb=2.5V), switch control MOSFET 536 is turned on, resulting in a shorted connection at MOSFET bridge 532. With reference to FIG. 2A, the result is a shorted connection at switches 230 between the AC_P/AC_N and DC0/DC1 connectors, respectively. Differential driver 212 is configured to turn off with high impedance and high voltage tolerance (for example DDC mode) and single ended drivers 214 are used to transmit data. As described below, external pull-up 242 will power internal dynamic bias circuits which will ramp the voltages at the gates of dynamic bias MOSFETs 534, 538 in MOSFET bridge 532 when Vddio is off. Vddio will power dynamic bias MOSFETs 534, 538 in MOSFET bridge 532 instead of external pull up power when Vddio is on Node voltages of the MOSFET bridge 532 are listed as follow in AC and DC interfaces in Table 2:

TABLE 2

Bridge Operation Analysis 1X Power, 1X Transistors & 2X External Pull up Voltage

| Coupling | NG1 | Modeb | NG1AC | Nwell | PADDC & PADAC | External Pull Up |
|---|---|---|---|---|---|---|
| AC | 2.5-Vthn (1x) | 0 | 2.5 V (1x) | 2.5 V (1x) | AC output | N/A |
| DC | 2.5 V (1x) | 2.5 V (1x) | 2.5 V (1x) | 5.0 V (2x) | 5 V (2x) | 5 V (2x) |
| DC | 2.5 V (1x) | 2.5 V (1x) | 2.5 V (1x) | 2.5-Vthn | 0 | 5 V (2x) |

Figure 6:
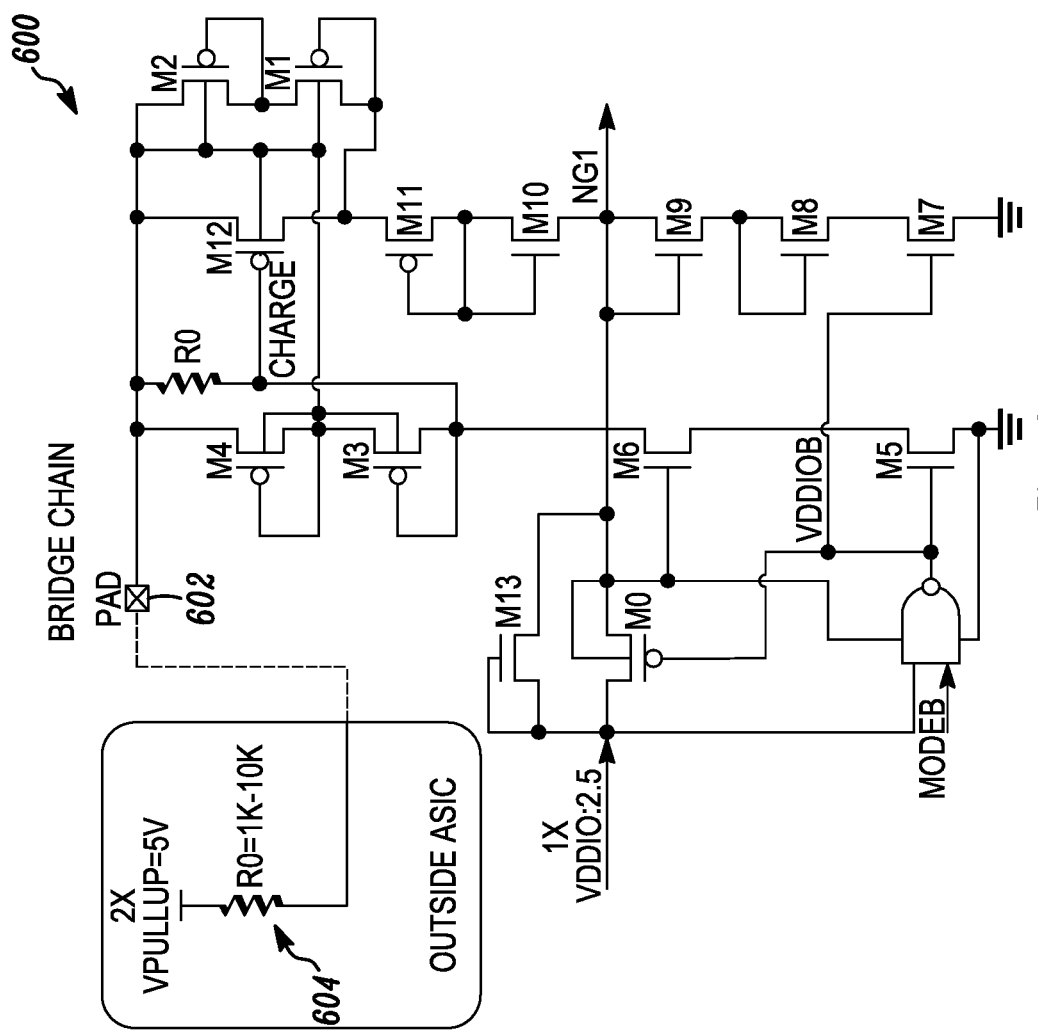
FIG. 6 is a schematic block diagram illustrating a circuit to generate signal NG1 of FIG. 5.

FIG. 6 illustrates a variable and dynamic bias circuit 600 designed to generate the signal NG1 of FIG. 5. Since in this example MOSFET bridge 532 is only required to tolerate 2× external pull up voltage instead of 3× voltage, the scheme shown in FIG. 4 can be simplified. Specifically, the scheme shown in FIG. 6 only generates one bias voltage (1× volts) and does not consume DC current when Vddio is on and Modeb is high (2.5V in the example).

In DC coupled mode, signal Modeb is high and equal to 2.5V in this case. Transistors M1, M2, M7, M8, M9, M10, M11 and M12 form a voltage divider and set up NG1 voltage level at 2.5V for the case where Vpullup=5V. Transistors M3, M4, M5 and M6 form another voltage divider and provide bias for transistor M12. Transistors M2 and M1 consist of a bypass circuit at start up to start the circuit. When 1× Vddio (2.5V in the example) is off and 2× external pull up (5V in the example) power is on, the circuit draws about 15-30 u current from external pull up and the voltage drop across external pull up resistor 604 is 200 mv at most. Thus PAD 602 voltage is about 4.8V. Transistors M3, M4, M6, M8, M9, M10, M11 and M12 are on, and transistors M1 and M2 transition from on to off at external pull up power start up since the voltage drop across M12 is dominant over one over M2 and M1 and is less than 2Vthp absolute value. Vddiob is high and equal to the NG1 voltage level, therefore, transistors M5 and M7 are on and transistor M0 is off. Thus, the NG1 voltage as derived from the voltage divider is about 2.5V. When both 1× Vddio and 2× external pull up power are on, Vddiob is 0 and transistors M5 and M7 are off, therefore, the two voltage dividers are off and no current is drawn from the 2× external pull up. Transistor M0 is on and NG1 is shorted with Vddio. In other words, NG1 is 2.5V regardless of PAD 602 status. The signal Charge is asserted by resistor R0 so that transistors M3, M4 and M12 can avoid potential overstress voltage, limiting voltage across their gate-junctions or junctions-junctions to be 1× voltage.

In AC coupled mode, signal Modeb is 0 and vddiob is high and equal to 2.5V in this case. Thus, transistors M5 and M7 are on and transistor M0 is off. NG1 is 1.8-Vthn since transistor M13 is diode connected and always on. As previously mentioned, the maximum allowable voltage range across DC0 and DC1 is between 2.5V+Vthp and −Vthn for AC coupling mode, and PAD 602 voltage cannot impact NG1 voltage. Transistor M11 is off, thus NG1 voltage cannot impact PAD 602 voltage. Transistors M7, M8, M9 are on and consume current in the range of 10-30 u from Vddio. Transistors M3, M4, M5, M6 are on and may consume currents in the range of 5-30 u from PAD 602 if PAD 602 voltage is greater than 2*Vthp absolute value.

When MOSFET bridge 532 is used in the circuit 200 of FIG. 2A, the differential driver 212 and single ended drivers 214 are also implemented with 1× voltage tolerant devices, 1× power supply voltage, and support for 2× external pull up voltage.

Differential driver 212 supports both AC interface standards, such as DisplayPort Auxiliary (DP AUX), and DC interface standards, such as open drain interface or Display Data Channel (DDC). DP AUX terminates with 50 ohm impedance at both source and destination sides as required by the DisplayPort standard. External device detection is performed at power up or plug/unplug connection to determine what kind of panels, for example, DP or DVI/HDMI, are connected and to configure differential driver 212 to the correct mode.

Single ended drivers 214 only support DC interface standards, such as open drain interface or Display Data Channel (DDC). The external pull up voltage of the DDC interface can be up to 2× higher than the IC 1× power supply voltage and the maximum allowable 1× device voltage. When the 2× external pull up voltage is on and IC 1× power supply voltage is off, 1× bias voltage has to be generated internally from the 2× external pull up voltage to protect the 1× voltage tolerant devices. When the IC 1× power supply voltage is on, 1× bias voltage is derived from the IC 1× power supply voltage. The N-well of the IC PMOS output buffer should be floating since the 2× external pull up voltage is greater than the IC 1× power supply voltage.

As will be appreciated, IC 210 may be formed using conventional application specific integrated circuit (ASIC) design and manufacturing techniques. IC 210 may for example be formed from Hardware Description Language (HDL) code that describes IC 210 and its various circuits, exemplary of embodiments of the present invention. The HDL code may be stored on a computer readable medium.

Other modifications will be apparent to those skilled in the art and, therefore, the invention is defined in the claims.

What is claimed is:

1. An integrated circuit (IC) chip adapted to be selectively AC or DC coupled to an external device, said IC chip comprising:
   a first connector on said IC chip for connection to a coupling point external to said IC chip by way of a coupling capacitor, external to said IC chip, to AC couple said IC chip to said external device;
   a second connector on said IC chip for connection to said coupling point, external to said IC chip, to DC couple said IC chip to said external device;
   switching logic, integrated on said IC chip to selectively interconnect said first connector and said second connector of said IC chip through said IC chip, thereby bypassing said coupling capacitor, when said IC chip is DC coupled to said device by way of said second connector.

2. The IC chip of claim 1, wherein said switching logic comprises a MOSFET bridge.

3. The IC chip of claim 2, wherein said MOSFET bridge comprises a switch control MOSFET interconnected between said first and second connectors, said switch control MOSFET receiving at its gate a mode status signal for turning on said switch control MOSFET and thereby shorting said MOSFET bridge when said circuit is DC coupled to said device.

4. The IC chip of claim 3, wherein said MOSFET bridge further comprises a plurality of nMOSFETs connected in series with said switch control MOSFET, said plurality of nMOSFETs providing a plurality of step down voltages relative to an external supply voltage.

5. The IC chip of claim 4, wherein the number of nMOSFETs in said MOSFET bridge is selected to tolerate a multiplication factor of an external supply voltage.

6. The IC chip of claim 4, wherein said MOSFET bridge further comprises a dynamic bias circuit for providing voltages at the gates of said nMOSFETs.

7. The IC chip of claim 6, wherein said MOSFET bridge further comprises a dynamic bias circuit for providing voltages at the gates of both said nMOSFETs and said pMOSFETs.

8. The IC chip of claim 4, wherein said MOSFET bridge further comprises a plurality of pMOSFETs, connected in parallel with said switch control MOSFET and said plurality of nMOSFETs.

9. A method of selectively AC or DC coupling an integrated circuit (IC) chip to an external device at a coupling point external to said IC chip, said IC chip comprising a first connector connected to said coupling point by way of a coupling capacitor external to said IC chip for AC coupling and a second connector connected to said coupling point for DC coupling, said method comprising:
   closing switching logic formed within said IC chip, to selectively interconnect said first connector and said second connector through said IC chip, thereby bypassing said coupling capacitor, when said IC chip is DC coupled to said device.

10. The method of claim 9, wherein said switch comprises a MOSFET bridge in said IC chip.

11. The method of claim 10, wherein said MOSFET bridge comprises a switch control MOSFET interconnected between said first and second connectors, said method further comprising receiving at a gate of said switch control MOSFET, a mode status signal for turning on said switch control MOSFET and thereby selectively shorting said MOSFET bridge when said IC chip is DC coupled to said device.

12. The method of claim 11, wherein said MOSFET bridge further comprises a plurality of nMOSFETs connected in series with said switch control MOSFET, said plurality of nMOSFETs providing a plurality of step down voltages relative to an external supply voltage.

13. The method of claim 11, wherein said MOSFET bridge further comprises a dynamic bias circuit for providing voltages at the gates of said plurality of nMOSFETs.

14. The method of claim 12, wherein said MOSFET bridge further comprises a plurality of pMOSFETs, connected in parallel with said switch control MOSFET and said plurality of nMOSFETs.

15. The method of claim 14, wherein said MOSFET bridge further comprises a dynamic bias circuit for providing voltages at the gates of both said nMOSFETs and said pMOSFETs.

16. Computer readable medium storing code of a hardware description language for the formation of an IC chip as claimed in claim 1.

* * * * *

UNITED STATES PATENT AND TRADEMARK OFFICE
CERTIFICATE OF CORRECTION

PATENT NO. : 8,188,615 B2
APPLICATION NO. : 12/562703
DATED : May 29, 2012
INVENTOR(S) : Yamin Du et al.

It is certified that error appears in the above-identified patent and that said Letters Patent is hereby corrected as shown below:

In the Claims in claim 1, column 8, line 20, "capacitor, external" should read --capacitor external--

Signed and Sealed this
Twentieth Day of May, 2014

Michelle K. Lee
*Deputy Director of the United States Patent and Trademark Office*